United States Patent [19]
Sparks et al.

[11] Patent Number: 5,427,975
[45] Date of Patent: Jun. 27, 1995

[54] METHOD OF MICROMACHINING AN INTEGRATED SENSOR ON THE SURFACE OF A SILICON WAFER

[75] Inventors: Douglas R. Sparks; Ronald E. Brown; Robert L. Healton; John C. Christenson, all of Kokomo, Ind.

[73] Assignee: Delco Electronics Corporation, Kokomo, Ind.

[21] Appl. No.: 59,222

[22] Filed: May 10, 1993

[51] Int. Cl.⁶ .......................................... H01L 21/3065
[52] U.S. Cl. ...................................... 437/79; 437/901; 437/927; 156/644.1
[58] Field of Search ................. 437/79, 203, 901, 927; 156/644; 148/DIG. 73

[56] References Cited

U.S. PATENT DOCUMENTS

| | | | |
|---|---|---|---|
| 4,766,666 | 8/1988 | Sugiyama et al. | 29/610 SG |
| 4,888,300 | 12/1989 | Burton | 437/79 |
| 4,925,805 | 5/1990 | van Ommen et al. | 437/927 |

OTHER PUBLICATIONS

Z. Zhang, N. McDonald, "An RIE Process for Submicron Silicon Electromechanical Structures," Digest IEEE Int. Conf. on Solid St. Sensor and Actuators, pp. 520-523 (1991).

Editor, "Analog Devices Combines Micromachining and BiCMOS", Semiconductor International, Oct., p. 17 (1991).

Crazzolara et al., "Profile Control Possibilities for a Trench Etch Process Based on Chlorine Chemistry," J. Electrochem. Soc., vol. 137, No. 2, pp. 708-712 (Feb. 1990).

Powell et al., "Deep Si Trench Etching with a High Rate Process Through a n/n+/p Type Structure, Using a Triode Configured Reactor," The Electrochemical Society, Abstract No. 174, pp. 252-253 (1989).

*Primary Examiner*—Tom Thomas
*Assistant Examiner*—Chandra Chaudhari
*Attorney, Agent, or Firm*—Cary W. Brooks; Jimmy L. Funke

[57] ABSTRACT

A method for micromachining the surface of a silicon substrate which encompasses a minimal number of processing steps. The method involves a preferential etching process in which a chlorine plasma etch is capable of laterally etching an N+ buried layer beneath the surface of the bulk substrate. Such a method is particularly suitable for forming sensing devices which include a small micromachined element, such as a bridge, cantilevered beam, membrane, suspended mass or capacitive element, which is supported over a cavity formed in a bulk silicon substrate. The method also permits the formation of such sensing devices on the same substrate as their controlling integrated circuits. This invention also provides novel methods by which such structures can be improved, such as through optimizing the dimensional characteristics of the micromachined element or by encapsulating the micromachined element.

31 Claims, 6 Drawing Sheets

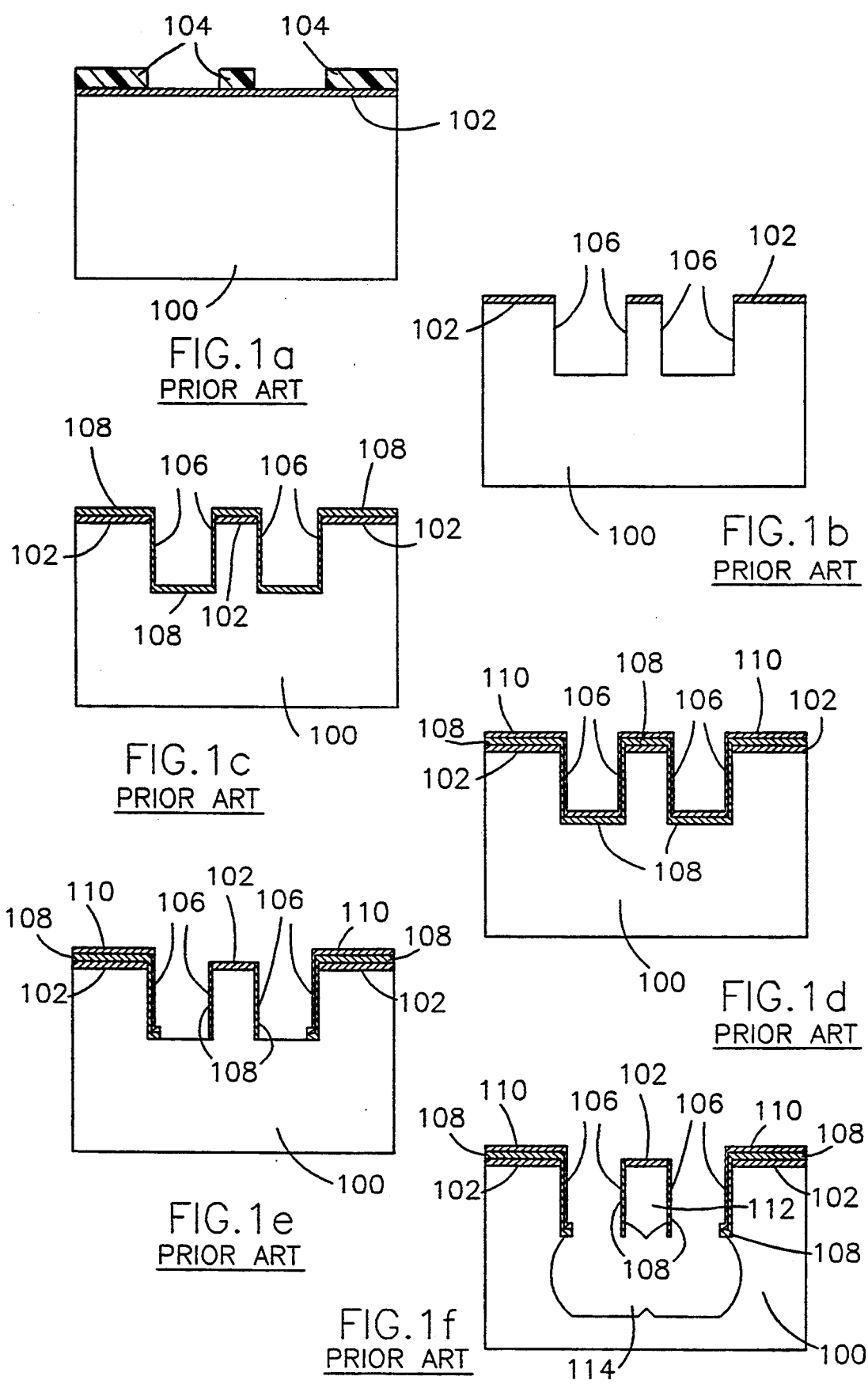

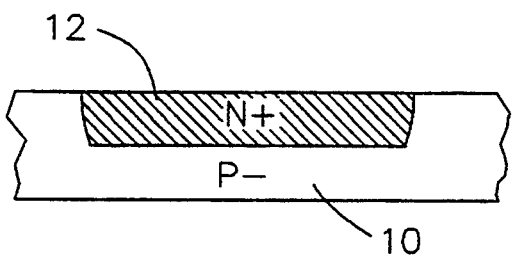
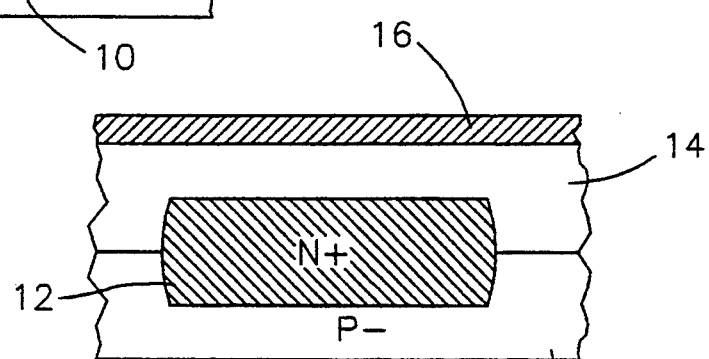
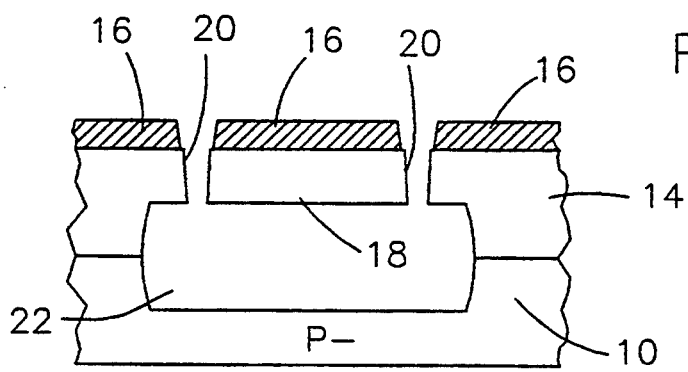
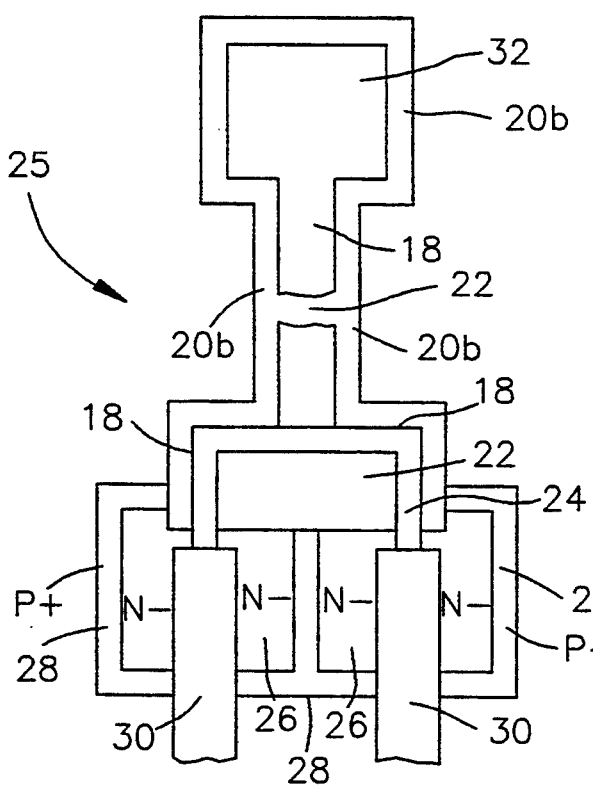

METHOD OF MICROMACHINING AN INTEGRATED SENSOR ON THE SURFACE OF A SILICON WAFER

The present invention generally relates to bulk micromachining processes used to form integrated circuit devices on or under the surface of a silicon wafer. More particularly, this invention relates to an improved method for micromachining integrated sensor devices on the surface of a silicon wafer which incorporates bipolar and BiCMOS devices, wherein the method encompasses the formation of bridges, cantilevered beams, membranes, suspended masses, and capacitive elements within the surface of the silicon wafer.

BACKGROUND OF THE INVENTION

Bulk micromachining of silicon wafers is well known in the semiconductor arts. Generally, this process involves forming semiconductor devices on a silicon wafer by etching the bulk silicon at the surface of the wafer, in contrast to etching methods in which semiconductor devices are formed by selectively etching layers which were previously deposited on the surface of the wafer substrate. Bulk micromachining can be used to form micromachined features in the surface of a silicon substrate from which sensing devices can be formed, and is generally preferred over etching deposited layers in the fabrication of sensing devices in that less warpage occurs, thereby enhancing the accuracy of the sensing device. Bulk micromachining is often conducted using a conventional wet etch process, which is isotropic in nature. Dry etching processes, such as plasma etching, are becoming more common because of their capability for higher packing density as a result of being anisotropic in nature.

In the past, sensing devices have often been fabricated by stacking silicon wafers on top of each other so as to form a cavity over which a sensing micromachined element, such as a beam, bridge or membrane, can be formed with the upper wafer. Alignment tolerances as well as sharp corners and edges on the wafers create points of stress concentration within the sensing device, which interfere with the ability of the micromachined element to accurately detect the pressure or motion for which the device is intended. Consequently, bulk micromachining methods are often preferred in that the residual stresses and stress concentrators common to stacked-wafer techniques can generally be avoided.

A recent example of such a bulk micromachining method is disclosed by Zhang and McDonald (Digest IEEE Int. Conf. on Solid State Sensors and Actuators, pp. 520–523 (1991)), as generally illustrated in FIGS. 1a through 1f. Zhang and McDonald teach thermally depositing a silicon dioxide layer 102 on an arsenic-doped n-type <100> substrate 100 which is to be bulk micromachined. The silicon dioxide layer 102 is then photolithographically patterned using photoresist 104 which has been spun on the silicon dioxide layer 102, as indicated in FIG. 1a. A plasma etching process is then used to form trenches 106 to a depth of about 4 micrometers in the substrate 100, as shown in FIG. 1b.

A second layer of silicon dioxide (not shown) is then thermally grown on all exposed surfaces, followed by the deposition of another layer of silicon dioxide 108 using plasma enhanced chemical vapor deposition (PECVD), shown in FIG. 1c. After patterning and etching through the layers of silicon dioxide to provide a metal-to-substrate contact window, a layer of aluminum 110 is deposited on the upper layer of silicon dioxide 108, as indicated in FIG. 1d, from which electrodes are patterned. An anisotropic etch is then used to remove the silicon oxide 108 from the bottom of the trenches 106, as shown in FIG. 1e, and then an isotropic plasma etch is used to undercut the substrate 100 between the trenches 106 so as to form a cavity 114 beneath the surface of the substrate 100. As shown in FIG. 1f, the cavity 114 creates a suspended beam 112 which is suitable for sensing motion.

The above process is likely to be suitable for many applications, in that plasma etching techniques are capable of micromachining small features which can be integrated onto a chip containing integrated circuitry. However, the plasma etch process taught by Zhang and McDonald does not readily lend itself to forming selectively shaped cavities, in that the isotropic nature of the plasma etch requires that the process include a silicon dioxide deposition and etch to limit the direction of the etching action. Where no silicon dioxide layer or metal layer is present, the plasma etch will proceed uninhibited until the etching process is discontinued, as suggested by the shape of the cavity 114 shown in FIG. 1f. Accordingly, the process taught by Zhang and McDonald requires an oxide deposition and etch after the trench has been etched to roughly define the cavity. While such additional steps are entirely conventional, it is a continuous objective in the semiconductor industry to minimize the number of processing steps necessary to form any given device.

Furthermore, the teachings of Zhang and McDonald are limited to the formation of bridges and cantilevered beams. In other words, their teachings are absent any method by which larger structures can be formed, such as a suspended mass for motion sensing. Nor do their teachings suggest how the trenches can be suitably sealed so as to form membranes for sensing pressure or, alternatively, encapsulated so as to protect the bridge and cantilevered beams.

Thus, it would be desirable to provide an improved method for forming small, integrated micromachined elements in a silicon wafer using a bulk micromachining process, in which the method reduces the number of processing steps necessary to form the desired micromachined elements. Furthermore, it would be desirable that such a method be conducive to further processing by which the micromachined elements can be adapted to form various types of sensing devices having a wide variety of possible configurations.

SUMMARY OF THE INVENTION

It is an object of this invention to provide an improved method for bulk micromachining a silicon wafer for purposes of forming a small feature-size micromachined element within the silicon wafer, wherein the micromachined element is suitable for use as a component of a semiconductor sensing device.

It is a further object of this invention that such a method require a minimal number of processing steps to form uniform cavities and trenches which define the micromachined element, while simultaneously enabling the cavities and trenches to be formed within the silicon wafer in a highly selective and controlled manner.

It is still a further object of this invention that such a method be conducive to forming various types of sensing devices having a wide variety of physical configurations.

It is yet another object of this invention that such a method lend itself to subsequent processing steps to further enhance the desired characteristics of the micromachined element.

In accordance with a preferred embodiment of this invention, these and other objects and advantages are accomplished as follows.

According to the present invention, there is provided a method for bulk micromachining the surface of a silicon substrate which encompasses a minimal number of processing steps. The method is particularly suitable for forming a sensing device that includes a small micromachined element, such as a bridge, cantilevered beam, suspended mass, membrane or capacitive element, which is supported over a cavity formed in the silicon substrate. The method enables the formation of a wide variety of sensing devices on a single silicon wafer, as well as enables the formation of a diverse variety of micromachined shapes, such as a narrow bridge or a wide paddle-shaped deflectable mass. This invention also provides novel methods by which such structures can be improved, such as through optimizing the dimensional characteristics of the micromachined element or by encapsulating the micromachined element.

The method involves forming an N+ region in the surface of the substrate, and then growing a silicon layer, such as an epitaxial silicon, from the surface of the substrate. As a result, the N+ region forms an N+ buried layer beneath the silicon layer. The silicon layer is then masked and plasma etched so as to form one or more trenches through the silicon layer and into the N+ buried layer. As a result of a preferred plasma etch method taught by this invention, the N+ buried layer can be laterally etched so as to form a cavity beneath the surface of the silicon layer. Generally, the shape of the cavity will be uniformly rounded as a result of the N+ buried layer being formed without sharp edges or corners. Furthermore, the dimensions of the cavity can be readily configured for the particular sensing application to form a micromachined element between the cavity and the surface of the silicon layer. Depending on the sizes and shapes of the desired cavity and trenches, the micromachined element can be formed as a bridge, cantilevered beam, deflectable mass, membrane, or capacitive element.

According to this invention, the preferred plasma etch is conducted using a chlorine-containing gas as the etchant medium. The chlorine gas is preferably held at a pressure of about 100 to about 1000 mTorr, and the wafer is preferably stabilized at a temperature of at least about 35° C. Under these conditions, the N+ buried layer is preferentially etched, with the silicon substrate surrounding the N+ buried layer being substantially unaffected. As a result, the size and shape of the cavity can be accurately defined by appropriately defining the size and shape of the N+ buried layer. Consequently, the configuration of the micromachined element can also be accurately predetermined, permitting the fabrication of an accurate sensing device.

Also in accordance with this invention, the micromachined element can be further defined by depositing a polysilicon film such that all or a portion of the trenches are filled. With this method, the micromachined element can be formed as a sealed reference chamber for a pressure sensing device, a narrow cantilevered beam or a relatively large paddle-shaped mass for a motion sensing device, or a capacitive element having a high capacitance value.

The present invention also encompasses novel methods by which the micromachined element can be encapsulated so as to be isolated from the surrounding environment of the silicon wafer.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawing wherein:

FIGS. 1a through 1f illustrate the prior art bulk micromachining processing steps taught by Zhang and McDonald;

FIGS. 2a through 2c illustrate an improved bulk micromachining process by which a micromachined element is defined as a result of forming a cavity beneath the surface of a silicon wafer, in accordance with this invention;

FIG. 3 is a plan view of a representative motion sensing device which can be fabricated in accordance with the bulk micromachining process of this invention;

DETAILED DESCRIPTION OF THE INVENTION

Figure 4A:
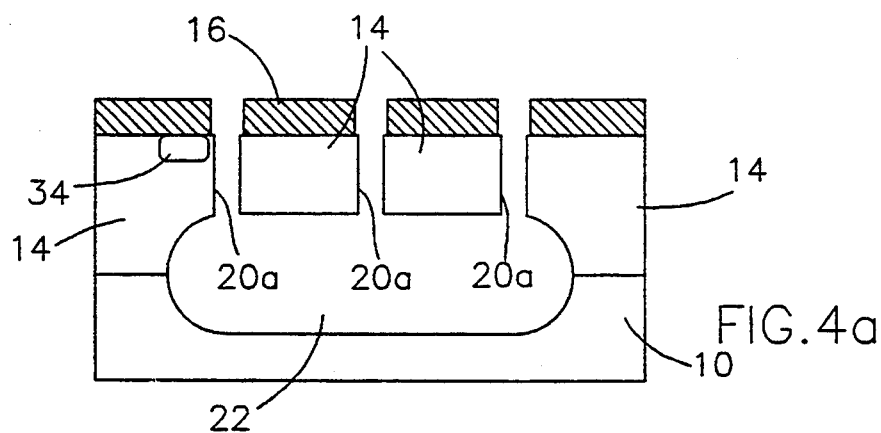
FIGS. 4a through 4c illustrate a method for sealing the cavity of FIG. 2c so as to form a sealed reference chamber for a pressure sensing device, in accordance with a preferred aspect of this invention.

A method is provided by which micromachined elements can be accurately bulk micromachined in the surface of a silicon wafer using a minimal number of processing steps. The bulk micromachining method of this invention enables well-defined trenches and cavities to be formed in a silicon wafer, resulting in the formation of a micromachined element, such as a bridge or a cantilevered beam, at or under the surface of the silicon wafer. Furthermore, the bulk micromachining method of this invention offers an improvement over the teachings of Zhang and McDonald in that the oxide deposition and etch step after the trenches are formed is completely eliminated. In accordance with additional methods taught by this invention, such micromachined elements can be modified to form a membrane for a pressure sensing device, a suspended mass for a motion sensing device, or a parallel plate capacitor. This invention also encompasses methods by which such a micromachined element can be encapsulated so as to be isolated from the environment surrounding the silicon wafer.

The bulk micromachining method of this invention is a silicon surface etching process which employs a plasma etching technique. In particular, the preferred etching technique employs an etchant medium which will preferentially attack N+ doped silicon in the form of an N+ buried layer. The parameters of the etching process are specifically selected such that the N+ buried layer will be preferentially etched while the surrounding substrate material will be substantially unaffected. As a result, by forming trenches into the substrate, a lateral etch can occur wherever a trench encounters an N+ buried layer.

As shown in FIGS. 2a through 2c, the preferred bulk micromachining method of this invention begins with the creation of an N+ region 12 within a suitable substrate. The preferred method will be described in reference to fabricating micromachined elements within a bipolar or bipolar-complementary metal-oxide-semiconductor (BiCMOS) process, though those skilled in the art will readily recognize that the teachings of this invention can also be extended to other processes, including CMOS processes.

As shown, the N+ region 12 is preferably formed within a lightly-doped p-type substrate 10. This N+ region 12 will later form the N+ buried layer 12 mentioned above. The substrate 10 is doped with a suitable dopant, such as the ions of boron or another trivalent element, so as to have a suitable acceptor concentration, as is well known in the art. The substrate 10 represents a portion of a monocrystalline silicon wafer which is made sufficiently thick so as to permit handling, while the lateral dimensions of the wafer are generally large enough such that the wafer may be subsequently diced into a number of chips.

The N+ buried layer 12 can be formed using various suitable techniques known to those skilled in the art. However, in accordance with this invention, the N+ buried layer 12 is more preferably created by donor-implanting the substrate 10 with the ions of arsenic, phosphorous, antimony or another pentavalent element. A barrier layer of silicon oxide (not shown) having a thickness of about 8000 Angstroms is then thermally formed on the surface of the substrate 10. Using a photoresist mask (not shown) and known photolithography techniques, the barrier layer is patterned to define the region of the substrate 10 in which the N+ buried layer 12 is to be formed. The barrier layer is then etched down to the surface of the substrate 10 and the photoresist mask is stripped. The donor ions are then implanted into the substrate 10 to form the N+ region 12. The donor ions are preferably subjected to an accelerating voltage of about 100 KeV and implanted to a dosage of about $5 \times 10^{15}$ ions/cm$^2$. The substrate 10 is then heated to a temperature of about 1250° C. for a duration of about 2 hours to drive the donor atoms deeper into the substrate 10. The barrier layer of silicon oxide is then removed from the surface of the substrate 10 in any conventional manner.

The resulting N+ region 12 preferably has an average concentration of greater than about $1 \times 10^{18}$ impurities/cm$^3$. As will become more apparent, the dimensional characteristics of the N+ region 12, such as its length, width and depth, can vary with the particular application, depending on the geometric configuration of the micromachined element desired to be formed.

As shown in FIG. 2b, an epitaxial layer 14 is then grown from the surface of the substrate 10 so as to bury the N+ region 12, thus establishing the N+ buried layer 12. The epitaxial layer 14 can be formed in a completely conventional manner, with its thickness being tailored to the particular requirements of the application. As will be apparent to those skilled in the art, the inclusion of the N+ buried layer 12 in the substrate 10 is compatible with bipolar and BiCMOS processes which typically include an N+ buried layer under an epitaxial silicon layer. This method is also compatible with CMOS processes which do not usually include an N+ buried layer, though an additional masking step would be required to form the N+ buried layer 12.

Prior to etching, an oxide layer 16 is grown or deposited in a conventional manner on the epitaxial layer 14. The oxide layer 16 can be between about 8000 and about 12,000 Angstroms thick, which is sufficient to provide a protective layer to the epitaxial layer 14 during the subsequent etching process. The oxide layer 16 is patterned using a photoresist mask (not shown). A plasma etch is then used to selectively remove the oxide layer 16 from each surface region of the epitaxial layer 14 which corresponds to the desired placement of a trench. The photoresist mask is then removed and the preferred silicon surface etching process of this invention is performed.

As previously noted, the preferred etching method is a plasma etching process which is conducted using a chlorine-containing gas or a suitable chlorine compound as the etchant medium. The preferred chlorine plasma etching process is critical in terms of its ability to preferentially form a cavity which extends laterally beneath the surface of the epitaxial layer 14. To achieve this result, chlorine gas is preferably held at a pressure of about 100 to about 1000 mTorr, and the substrate 10 is preferably held at a temperature of at least about 35° C., such that the chlorine plasma etching process acts to preferentially etch the N+ buried layer 12, instead of the epitaxial layer 14 and the substrate 10.

While the above conditions are critical to performing the lateral etch of the N+ buried layer 12, other known and conventional etching methods can be employed to first form one or more trenches 20 through the epitaxial layer 14, as shown in FIG. 2c, for the purpose of gaining access to the N+ buried layer 12. Accordingly, the present invention encompasses the chlorine plasma etch process of this invention as well as any other foreseeable trench etching process, for the purpose of forming trenches 20 through the epitaxial layer 14.

Once access is gained to the N+ buried layer 12 via one or more trenches 20, the preferred chlorine plasma etch process is used to preferentially etch the N+ buried layer 12 so as to form a cavity 22 beneath the epitaxial layer 14. As shown in FIG. 2c, the preferred chlorine plasma etch process of this invention does not substantially affect either the lightly-doped epitaxial layer 14 or the substrate 10. Accordingly, the size and shape of the cavity 22 is defined by the size and shape of the N+ buried layer 12. Generally, the resulting shape of the cavity 22 will be uniformly rounded as a result of the N+ buried layer 12 being naturally formed without sharp edges or corners. Using the preferred etching process, lateral etches of up to 52 micrometers per side have been observed, which is greater than that achievable by the prior art. Furthermore, using the preferred plasma etching process, the lateral N+ buried layer etch aspect ratio can exceed 10:1.

The portion of the epitaxial layer 14 above the cavity 22 defines a micromachined element 18. The precise shape of the micromachined element 18 depends on the shape and number of trenches 20 formed, the size and shape of the cavity 22, and the depth of the cavity 22 below the upper surface of the epitaxial layer 14. Thus, the precision by which the width of the micromachined element 18 can be defined is primarily dependent on the accuracy of the trench mask, while the precision by which the thickness of the micromachined element 18 can be defined is primarily dependent on the ability to accurately control the growth of the epitaxial layer 14. Typically, lateral accuracies of about 0.1 micrometers can be readily achieved using conventionally-known patterning techniques, while epitaxial growth can be controlled to within 5%, permitting the fabrication of a precision micromachined element 18.

By using the preferred plasma etch technique of this invention, extremely fine micromachined elements 18 can be formed in the epitaxial layer 14. Referring to FIG. 3, an illustrative example of a type of motion sensing device 25 which can be formed with the method of this invention is shown. The micromachined element 18 for this motion sensing device 25 is an n-type cantilevered beam which includes two branches on which a p-type resistor 24 is formed. As illustrated, the micromachined element 18 is supported above a large open cavity 22 and surrounded by an elongate trench 20b on three sides. While the large open cavity 22 may alternatively be formed during the etching process as a trench, the cavity 22 beneath the micromachined element 18 is formed exclusively by the lateral etching of an N+ buried layer 12, in accordance with the process shown in FIGS. 2a through 2c. The cantilevered beam terminates in a large deflectable accelerometer mass 32 which is also surrounded by the narrow trench 20b and suspended over the cavity 22. The motion sensing device 25 further includes conventional features, such as metal electrodes 30 and a pair of N-epitaxial regions 26 which are isolated from the remainder of the substrate 10 by a combination of trench and P+ junction isolation 28.

As a result of the chlorine plasma etching process of this invention, the motion sensing device 25 illustrated in FIG. 3 can be fabricated with cantilevered beams having a width of as little as about 1 micrometer and an accelerometer mass area of as little as 100 $\mu m^2$. Such an extremely small motion sensing device 25 enables one-chip accelerometers to be fabricated more easily alongside their corresponding integrated control circuits. It will be apparent to those skilled in the art that numerous other suspended mass configurations are possible.

Figure 4B:
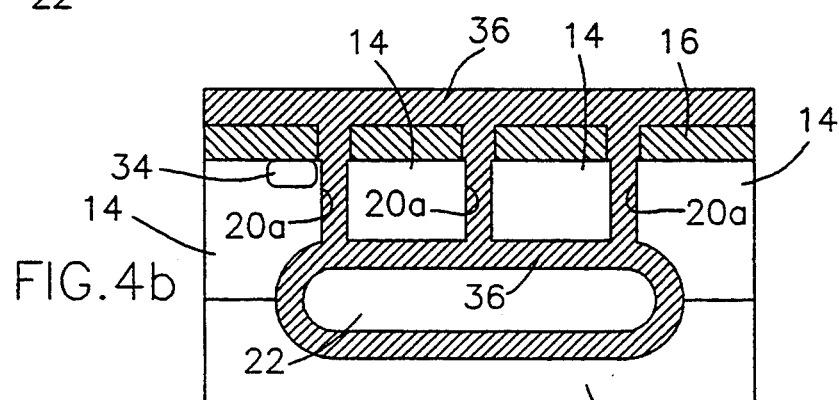
Figure 4C:
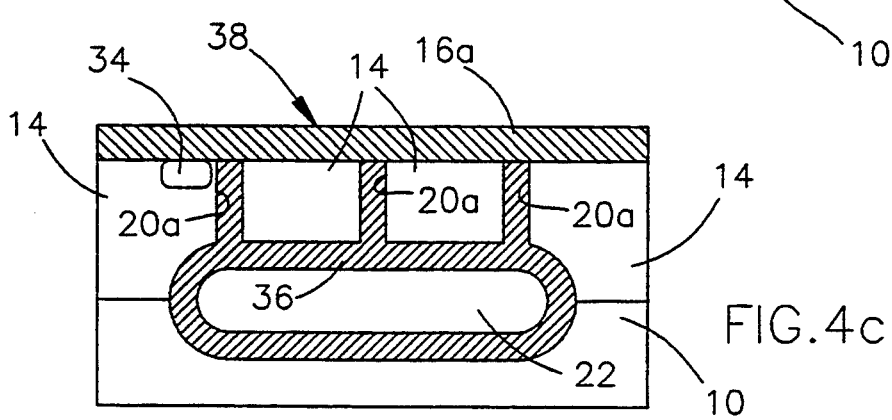

With additional processing steps, various other types of sensing devices can be fabricated using the method of this invention. FIGS. 4a through 4c demonstrate how a pressure sensing membrane 38 can be fabricated by sealing the cavity 22 from the surface of the epitaxial layer 14 with a thin silicon membrane. In accordance with this invention, the additional processing requires only one additional masking step beyond conventional integrated circuit processing, and involves a novel method of sealing the trenches 20 with a polysilicon layer 36, such that the polysilicon layer 36 completely plugs the trenches 20.

Illustrated in FIGS. 4a through 4c is a piezoresistor 34 which can be formed in any conventional manner to serve as the sensing element for the pressure sensing membrane 38, which is composed of the epitaxial layer 14, the polysilicon layer 36, and the oxide layer 16. As shown, the piezoresistor 34 is a diffused piezoresistor formed in the epitaxial layer 14 in accordance with known methods. However, for a higher temperature capability, it may be preferable that the piezoresistor 34 be a polysilicon piezoresistor (not shown) which can be fabricated from the polysilicon layer 36 by performing an additional mask and implant, as will be noted where appropriate below.

The piezoresistor 34, as well as the integrated sensor control circuits (not shown) for the pressure sensing membrane 38, can be formed on the same epitaxial layer 14 using standard integrated circuit processing. Because only one additional masking level is required to perform the bulk micromachining process of this invention, such integrated circuit processing can be completed prior to formation of the trenches 20 and cavity 22. Otherwise, the preferred method for forming the pressure sensing membrane 38 shown in FIGS. 4a through 4c begins with the preferred bulk micromachining process of this invention.

In the discussion that follows, the trenches are designated as being circular, closely-spaced trenches 20a having a diameter of less than about 2 micrometers, so as to be able to later distinguish their columnar shape from other trench shapes. Those skilled in the art will recognize that the circular shape of the trenches 20a is not a design requirement, but is depicted only for illustrative purposes. Otherwise, the cavity 22 and silicon oxide layer 16 shown in FIG. 4a are essentially identical to that shown in FIG. 2c for the description of the preferred bulk micromachining process.

Once the cavity 22 and the circular trenches 20a are formed, the layer of polysilicon 36 is deposited on the silicon oxide layer 16 to a thickness of about 2 micrometers using any known method, such as a chemical vapor deposition process. As shown in FIG. 4b, the polysilicon 36 enters the circular trenches 20a and the cavity 22 so as to hermetically seal the cavity 22 from the surface of the epitaxial layer 14. In a preferred embodiment, the polysilicon 36 is deposited in a vacuum such that the cavity 22 is sealed under vacuum to enhance its pressure sensing capability. The pressure sensing membrane 38 is completed by etching back the polysilicon layer 36 from the silicon oxide layer 16, using a standard plasma etch endpoint technique so as to leave the polysilicon 36 within the circular trenches 20a and the cavity 22. The oxide layer 16 is then stripped and a second oxide layer 16a is formed, as shown in FIG. 4c.

Prior to etching back the polysilicon layer 36, the aforementioned polysilicon piezoresistor (not shown), as well as numerous other active integrated circuit devices such as polysilicon MOS gates and polysilicon resistors, can be fabricated from the polysilicon layer 16 in accordance with the following procedure. First, the polysilicon layer 36 is appropriately doped and a portion of the doped polysilicon layer 16 is masked so as to define the desired device or devices. The exposed areas of the polysilicon layer 36 are then etched from the surface of the oxide layer 16, the masking material is removed, and the dopant in the remaining polysilicon layer is activated in a known manner so as to form an active integrated semiconductor device. While the formation of a polysilicon device as described above is an optional feature of this invention, such a capability is a highly advantageous secondary benefit which is made possible by the preferred processing method illustrated in FIGS. 4a through 4c.

A fundamental benefit to the preferred processing method of this invention lies in the manner in which the cavity 22 is created. Because the cavity 22 can be formed with rounded corners as a result of the preferred bulk micromachining process, in contrast to the sharp corners which are formed using current stacked wafer fabrication techniques, the pressure sensing membrane 38 described above is able to substantially avoid stress concentrations associated with such sharp corners and edges. As a result, the piezoresistor 34 is more likely to be in a uniform stress field, such that stresses induced by pressure applied to the surface of the pressure sensing membrane 38 will be more accurately detected by the piezoresistor 34. Alignment of the piezoresistor 34 is easier and more precise when the piezoresistor 34 and the cavity 22 are defined from the front surface of the wafer.

Figure 5:
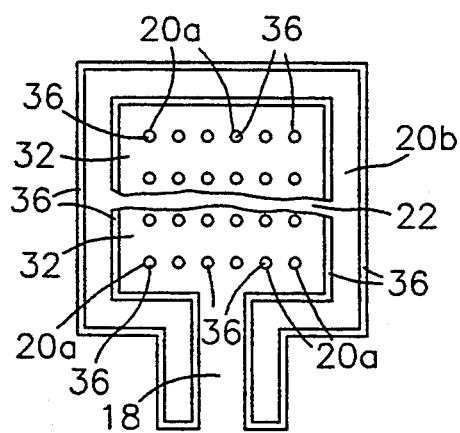
FIG. 5 is a further illustration of the method of FIGS. 4a through 4c by which the deflectable mass of FIG. 3 can be fabricated.

As shown in greater detail in FIG. 5, the accelerometer mass 32 of FIG. 3 can also be advantageously fabricated using the polysilicon deposition process of this invention. A trench 20b is used to define the lateral dimensions of the accelerometer mass 32. The selective removal of the silicon oxide layer 16 from those surface regions of the epitaxial layer 14 corresponds to the desired placement of the trenches 20a and 20b, as shown. The bulk micromachining etch of this invention then proceeds as previously described.

In FIG. 5, the circular trenches 20a are differentiated from the elongate trench 20b because each primarily serves a different function. The circular trenches 20a promote the lateral etching of the N+ buried layer 12 to form the cavity 22, while the elongate trench 20b serves to release the outer edge of the accelerometer mass 32 from the adjacent substrate 10. One skilled in the art will realize that the number and diameter of the circular trenches 20a, as well as the length and width of the elongate trench 20b, may be tailored to the desired size of the accelerometer mass 32. The size of the circular and elongate trenches 20a and 20b are limited by the ability of the polysilicon deposition process to plug the circular trenches 20a with polysilicon 36, while only coating the walls of the elongate trench 20b with the polysilicon 36 such that the accelerometer mass 32 is able to move relative to the substrate 10 in response to an acceleration. Generally, a preferred diameter for the circular trenches 20a is less than about 2 micrometers, while the preferred width of the elongate trench 20b is at least about 5 micrometers. However, different dimensions for the trenches 20a can be produced if openings are desired in the accelerator mass 32 for improved damping behavior of the micromachined element.

Figure 6:
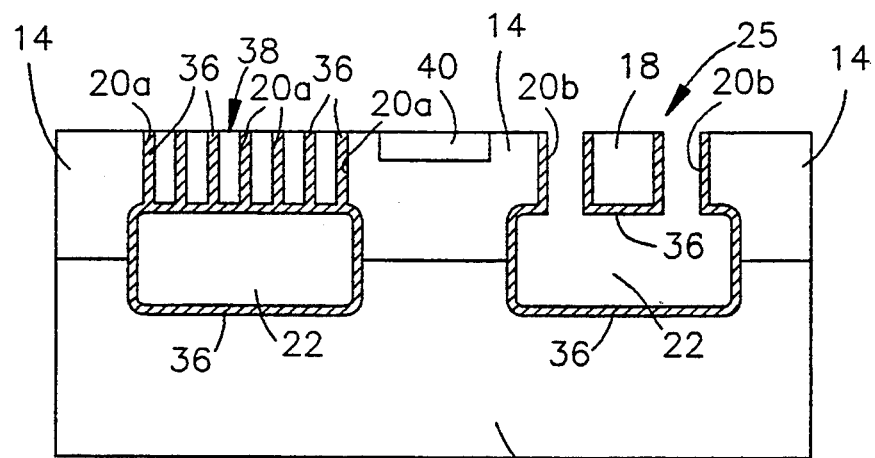
FIG. 6 shows the pressure sensing device of FIG. 4c which is fabricated adjacent the motion sensing device of FIG. 3, wherein each device can be formed adjacent and on the same substrate as the integrated circuitry used to process the signals from the devices.

The technique of forming both narrow circular trenches 20a and wider elongate trenches 20b on the same substrate with the bulk micromachining and polysilicon deposition processes of this invention facilitates the ability to form two different sensing devices adjacent each other on the same substrate. An example is shown in FIG. 6, in which the pressure sensing membrane 38 of FIG. 4c is formed adjacent the motion sensing device 25 of FIG. 3. Advantageously, in that the bulk micromachining and polysilicon deposition processes of this invention are compatible with bipolar and BiCMOS processes, integrated circuits 40 associated with the pressure sensing membrane 38 and the motion sensing device 25 can be formed immediately adjacent the devices on the same wafer, either before or after the bulk micromachining or polysilicon deposition processes are performed.

Figure 7:
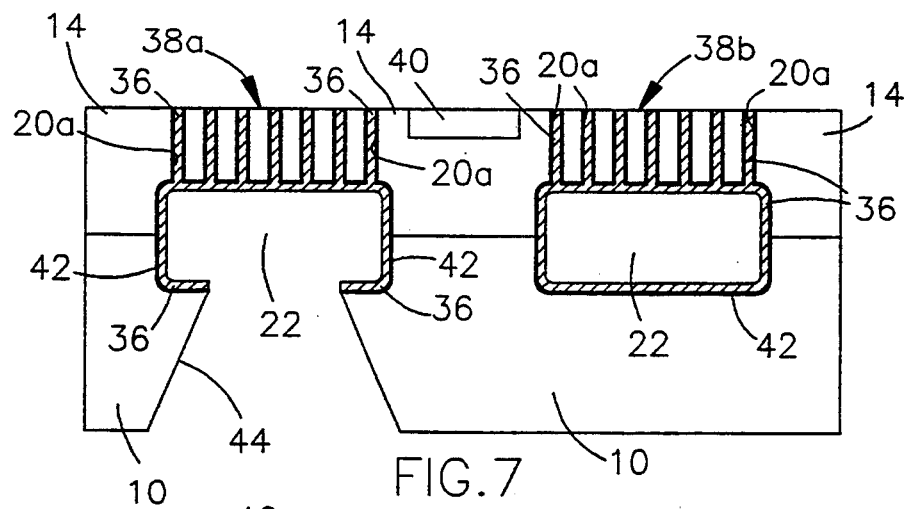
FIG. 7 shows a pair of pressure sensing devices of the type shown in FIG. 4c, wherein one of the pressure sensing devices is modified to sense pressure at the backside of the silicon wafer.

Another example of processing compatibility is illustrated in FIG. 7, in which two pressure sensing membranes 38a and 38b having respective piezoresistors (not shown) are formed in the same substrate 10, but with one membrane 38a being responsive to pressure on the backside of the wafer, while the other membrane 38b serves as a reference for the backside membrane 38a by detecting pressure only at the front side of the wafer. This arrangement is particularly advantageous in automotive applications, such as where the backside membrane 38a is exposed to the corrosive environment of an engine manifold to sense manifold pressure, while the frontside sensor 38b can be isolated from the manifold gases and used to sense atmospheric pressure. Such a capability is in contrast to the limited capabilities of stacked-wafer techniques and wet etching techniques currently employed to form semiconductor pressure sensors.

The pressure sensor combination of this invention is made possible by including two additional masking steps. The preferred process begins with using standard integrated circuit processing with a monocrystalline silicon wafer which has been cut so that its top surface lies along a <100> crystallographic plane, as is usual in MOS technology. Preferably, after the last thermal cycle used to form the integrated circuit 40, a silicon etch mask (not shown) is patterned into the thick oxide layer 16 (not shown) previously noted in the description of the bulk micromachining process of this invention. Two arrays of circular trenches 20a are then etched through the epitaxial layer 14 and into the N+ buried layer 12 (not shown), so as to permit the formation of a cavity 22 under each array of circular trenches 20a using the preferred plasma etching process of this invention. The circular trenches 20a are each preferably no more than about 2 micrometers in diameter, as noted previously under the discussion for FIGS. 4a through 4c.

After cleaning the epitaxial layer 14 in any conventional manner, the wafer is oxidized so as to form an oxide layer 42 on the walls of the circular trenches 20a as well as the interior surfaces of the cavities 22. In accordance with the process step illustrated in FIG. 4b, a thick polysilicon layer 36 having a thickness of about 1.5 to about 2 micrometers is then deposited to plug the circular trenches 20a and thereby seal each of the cavities 22 from the front side of the wafer. The polysilicon layer 36 is then etched back, as previously illustrated in FIG. 4c, leaving only the plugs within the circular trenches 20a and the polysilicon layer 36 on the interior surfaces of the cavities 22.

After an optional passivation step, a backside mask (not shown) is aligned with the membrane 38a and a conventional anisotropic wet silicon etch is performed which preferentially etches the <100> plane to form a backside trench 44 that extends up to the oxide layer 42 deposited on the surfaces of the cavity 22 corresponding to the membrane 38a. The oxide layer 42 serves to stop this wet etch process at the bottom of the cavity 22. Next, a buffered hydrofluoric acid etch is employed to etch away the oxide layer 42 at the bottom of the cavity 22, and the polysilicon layer 36 at the bottom of the cavity 22 is then etched using a conventional plasma etch process so as to vent the cavity 22 to the backside of the substrate 10. The above processes leave the membrane 38a intact, including the polysilicon layer 36 and the oxide layer 42 on the top of the cavity 22.

With the pressure sensor arrangement of FIG. 7, the corrosive manifold environment is exposed only to silicon on the backside of the wafer. Manifold gases are never exposed to the metal layers, bond pads, wire bonds or solder bumps of the integrated circuit 40, such that protective organic coatings are unnecessary. Similarly, the pressure sensor arrangement of this invention can operate in a highly reliable manner within other corrosive environments in which pressure measurement and comparison of two regions are required.

Figure 8A:
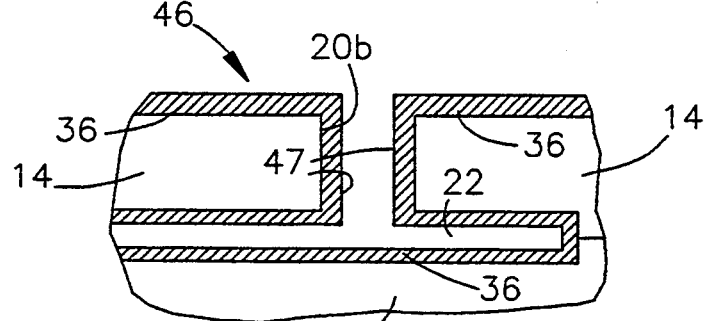
FIGS. 8a and 8b illustrate a method by which the process of this invention can be further modified to enhance the capacitance of a micromachined capacitor formed in accordance with the method of this invention.
Figure 8B:
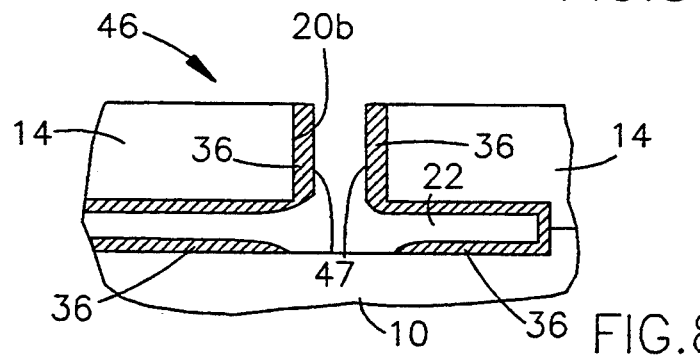

Referring to FIGS. 8a and 8b, an illustrative example of an improved micromachined silicon, capacitor 46 is shown which can be formed in an epitaxial layer 14 with the bulk micromachining and deposition processes of this invention. The capacitor 46 shown is a parallel plate capacitor, in which the capacitance value of the capacitor 46 is determined by the distance between a pair of capacitor plates 47. These plates 47 can be formed of single crystal silicon, polysilicon, or other suitable materials. As illustrated, the capacitor 46 is defined by a single elongate trench 20b and cavity 22 which separate the opposing capacitor plates 47. Both the elongate trench 20b and the cavity 22 are formed using the bulk micromachining process of this invention, in accordance with the process shown in FIGS. 2a through 2c.

Conventional trench etching processes are typically capable of creating a gap of no less than about 0.8 to about 1.5 micrometers between the capacitor plates. However, by adopting the polysilicon deposition process of this invention, the gap width can be significantly reduced to enhance the capacitance value of the capacitor 46. As shown in FIG. 8a, polysilicon 36 is deposited in much the same manner as outlined in FIGS. 4 and 5, taking note that the width of the elongate trench 20b must be greater than twice the thickness of the deposited polysilicon layer 36 so as to ensure that the trench 20b will not be closed during the deposition process. Afterwards, the polysilicon etch back described in reference to FIG. 4c is performed to produce the capacitor 46 shown in FIG. 8b. The etch back is conducted in a known manner such that the polysilicon 36 remains on the walls of the trench 20b. By making the polysilicon 36 electrically conductive by a suitable method known in the art, the polysilicon layer 36 forms an electrically integral part of the capacitor 46.

Here, the effect of the polysilicon deposition process of this invention is to reduce the spacing between the capacitor plates 47 by twice the thickness of the polysilicon layer 36. As a result, the capacitance value of the capacitor 46 can be more than doubled without the addition of a masking level to the integrated circuit processing of the substrate 10. While polysilicon is preferred for the layer 36, those skilled in the art will recognize that other electrically conductive materials could be deposited using known techniques instead of the preferred polysilicon. In addition, this method for reducing the plate spacing of a micromachined capacitor can also be used in other micromachined devices found in the prior art.

With additional processing steps, further improvements and refinements can be achieved with the various types of sensing devices fabricated using the bulk micromachining method of this invention. FIGS. 9a through 9d and 10a through 10c demonstrate how the motion sensing device 25 of FIG. 3 can be encapsulated for purposes of isolating the micromachined element 18 and accelerator mass 32 from the environment of the substrate 10. In accordance with this invention, these encapsulation processes can be performed within the wafer cleanroom environment, so as to significantly reduce the chance of particles being introduced into regions of the motion sensing device 25 which may affect the mobility of the micromachined element 18 or the accelerometer mass 32.

Figure 9A:
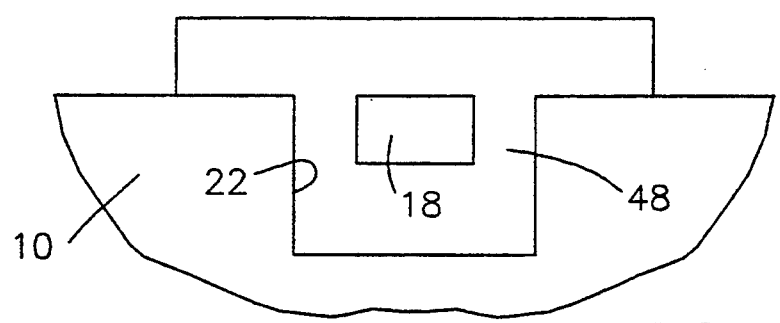
FIGS. 9a through 9d illustrate a method by which the process of this invention can be further modified to encapsulate the motion sensing device of FIG. 3.

Illustrated in FIGS. 9a through 9d is a polyimide encapsulation process which employs a sacrificial polyimide layer which may or may not be photo-definable. Though any surface structure or device can be encapsulated using the polyimide encapsulation process of this invention, in a preferred embodiment the encapsulation method begins with the bulk micromachining process of this invention, whereby a micromachined element 18 is formed so as to be suspended over a cavity 22. The micromachined element 18 will typically be a cantilevered beam or accelerometer mass, though other motion sensing members are foreseeable. A photosensitive polyimide layer 48 is then spun onto the substrate using known spinning processes, such that the cavity 22 is filled and the micromachined element 18 is immobilized. The polyimide layer 48 is then masked and developed in a conventional manner to leave the polyimide layer 48 primarily within the cavity 22 and over the adjacent surface of the substrate 10, as shown in FIG. 9a.

Figure 9B:
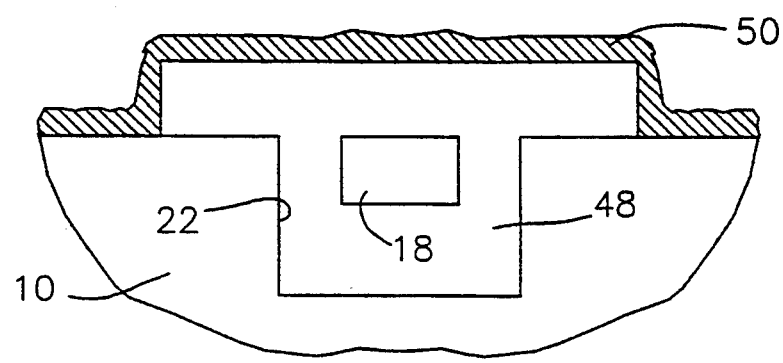
Figure 9C:
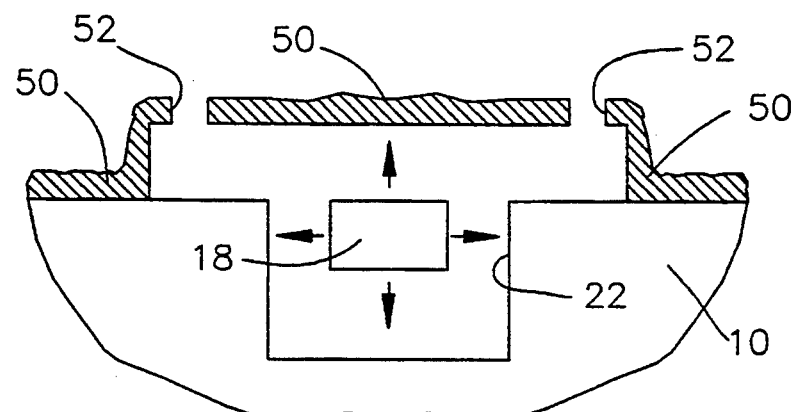
Figure 9D:
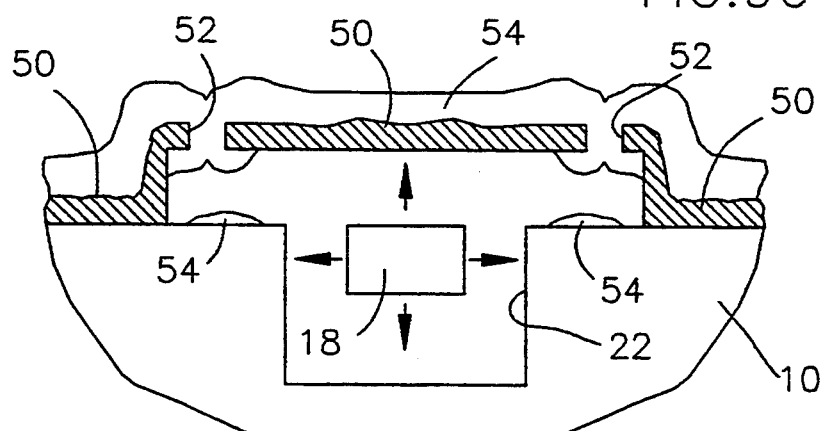

The polyimide layer 48 is then cured at a temperature of about 400° C. for a duration of about one hour, and a film 50 of either silicon nitride or silicon dioxide is then deposited to completely cover the polyimide layer 48, as shown in FIG. 9b. Low stress silicon nitride deposited by plasma enhanced chemical vapor deposition (PECVD) is preferred due to its ability to adhere well to the polyimide layer 48. The silicon nitride film 50 must then be annealed at a temperature of between about 350° C. and about 400° C. for a duration of about 45 minutes, so as to relieve stress and thereby ensure a high quality encapsulation chamber. Next, several holes 52 are photopatterned in a conventional manner in the silicon nitride film 50 to expose the polyimide layer 48 which overlays the adjacent substrate 10, as shown in FIG. 9c. The polyimide layer 48 is then completely removed using a conventional wet chemical or plasma oxygen etch through the openings 52 in the silicon nitride film 50, so as to permit movement of the micromachined element 18 within the enclosure formed by the silicon nitride film 50. An additional plasma silicon nitride film 54, or any other suitable film such as silicon dioxide or an organic material, is then applied so as to plug or cover the openings 52 in the first silicon nitride film 50 and encapsulate the micromachined element 18, as shown in FIG. 9d.

Those skilled in the art will recognize that a wide variety of microstructures can be encapsulated with this technique. Therefore, the teachings of this invention are not limited to the encapsulation of the motion sensing device 25 shown.

Figure 10A:
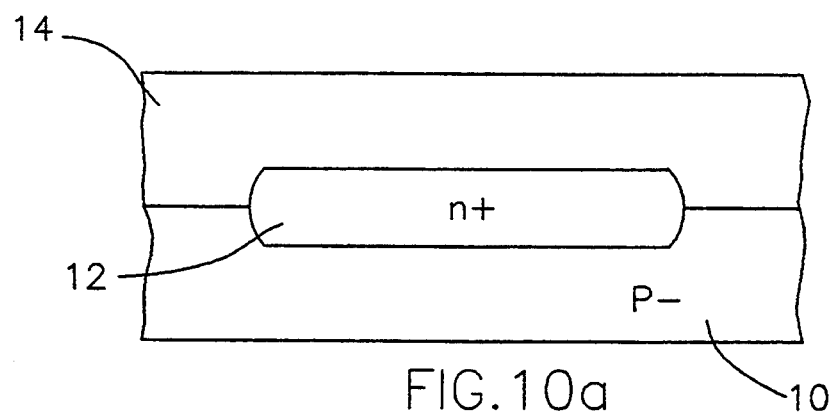
FIGS. 10a through 10c illustrate a second method by which the process of this invention can be further modified to encapsulate the motion sensing device of FIG. 3.
Figure 10B:
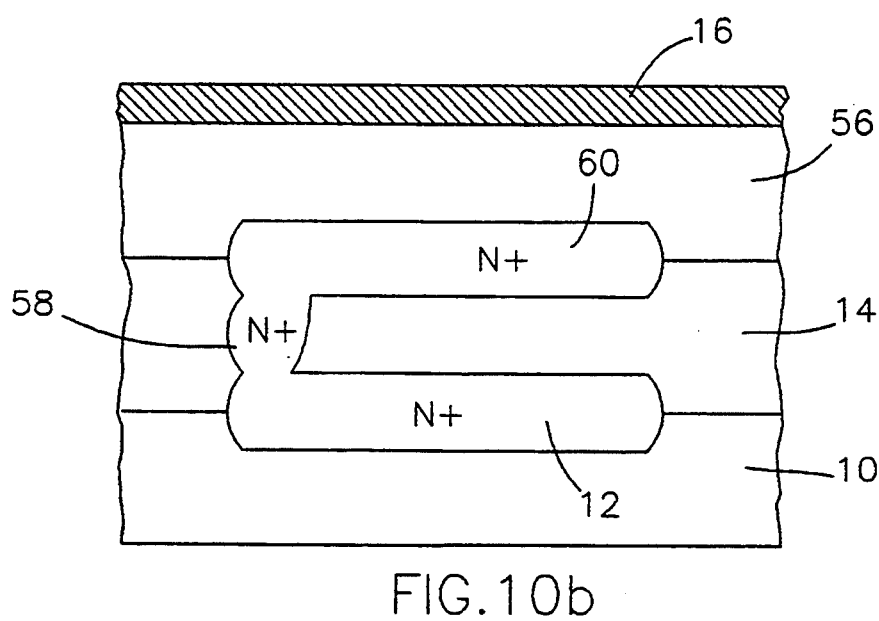
Figure 10C:
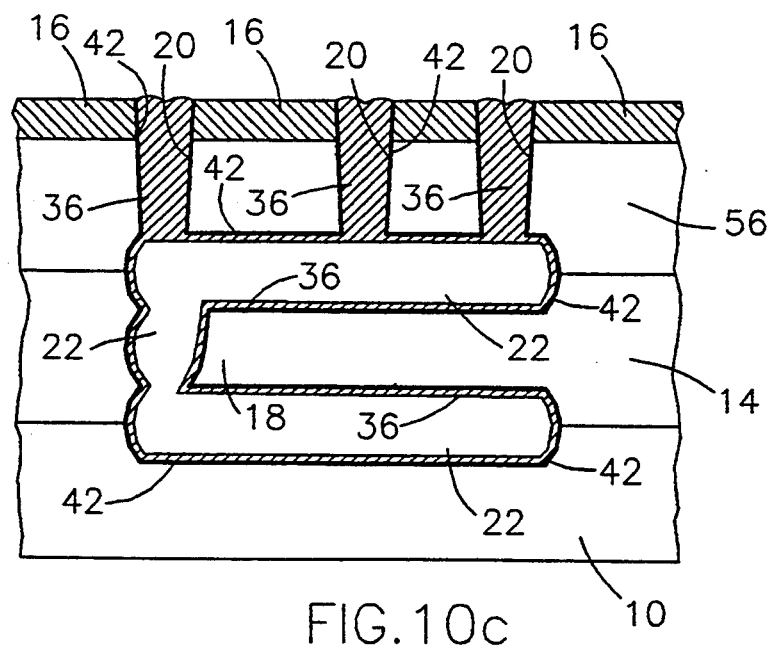

Illustrated in FIGS. 10a through 10c is the second encapsulation process of this invention, in which the bulk micromachining process illustrated in FIGS. 2a through 2c is employed to both define the cavity 22 and micromachined element 18, as well as form a bulk silicon encapsulating structure. This encapsulation process differs from the process of FIGS. 2a through 2c in that, in addition to the first N+ buried layer 12, second and third N+ buried layers 58 and 60, respectively, are formed in the epitaxial layer 14, as seen in FIG. 10b.

Most preferably, the second N+ buried layer 58 is formed by first forming an N+ region (corresponding to the third N+ buried layer 60) in the surface of the first epitaxial layer 14, and then further doping a portion of this N+ region above a portion of the first N+ buried layer 12. The first and third N+ buried layers 12 and 60 are preferably doped with arsenic ions because arsenic diffuses relatively slowly in silicon, while the second N+ buried layer 58 is preferably doped with phosphorus ions because phosphorous diffuses relatively quickly in silicon. A second epitaxial layer 56 is then grown over the third N+ buried layer 60, followed by the oxide layer 16. The substrate 10 is then heat treated sufficiently to diffuse a portion of the dopant of the second N+ buried layer 58 into a portion of the first N+ buried layer 12, as shown in FIG. 10b. Importantly, the heat treatment is carried out such that the dopant of the first N+ buried layer 12 does not diffuse into any portion of the third N+ buried layer 60 and, likewise, the dopant of the third N+ buried layer 60 does not diffuse into any portion of the first N+ buried layer 12. As a result, a portion of the first epitaxial layer 14 remains between a portion of the first N+ buried layer 12 and a portion of the third N+ buried layer 60.

The bulk micromachining process of this invention is then performed to etch several trenches 20 through the second epitaxial layer 56 and into the third N+ buried layer 60, and possibly into the first and second N+ buried layers 12 and 58. As noted before, the preferred chlorine plasma etch of this invention will preferentially etch the N+ buried layers 12, 58 and 60 so as to form a large cavity 22. Due to the layered arrangement of the N+ buried layers 12, 58 and 60, the cavity 22 will be configured with a lower chamber connected to an upper chamber by an intermediate passage. The micromachined element 18, shown here as a cantilevered beam, is formed between the upper and lower chambers. The top of the upper chamber and the bottom of the lower chamber can be formed to be at an advantageous distance from the micromachined element 18 so as to limit the range of movement of the micromachined element 18.

As shown in FIG. 10c, once the micromachined element 18 has been defined by the preferred plasma etching process, the trenches 20 formed in the second epitaxial layer 56 can be sealed in accordance with the polysilicon deposition process illustrated in FIGS. 4a through 4c. After this step, the interior surfaces of the cavity 22 will be coated with an oxide layer 42 and a polysilicon layer 36, in accordance with the teachings of this invention.

From the above, it can be seen that a wide variety of semiconductor devices can be fabricated with the bulk micromachining process outlined in FIGS. 2a through 2c, while numerous modifications and enhancements can be realized by further employing the polysilicon deposition process of FIGS. 4 through 8, as well as the encapsulation processes of FIGS. 9 and 10. Employed alone or in combination, the bulk micromachining process of this invention makes possible the formation of small integrated sensors which can be up-integrated onto integrated circuits. In comparison to conventional sensors fabricated with stacked-wafer techniques or by polysilicon deposition processes, the bulk micromachining process of this invention is able to fabricate micromachined elements which do not have the built-in stresses inherent with such prior art processes as a result of misalignment or nonuniform stress distribution. In comparison to conventional wet etching processes, the bulk micromachining process of this invention is able to fabricate smaller precision micromachined elements. In comparison to other bulk micromachining processes, such as that taught by Zhang and McDonald, the bulk micromachining process of this invention is able to achieve essentially the same advantageous results in fewer processing steps.

According to this invention, the preferred chlorine plasma etch, when performed under the prescribed conditions, will preferentially etch the N+ buried layer or layers within a silicon wafer, such that the silicon substrate surrounding the N+ buried layer is substantially unaffected. As a result, the size and shape of the cavity or cavities formed can be accurately defined by appropriately defining the size and shape of the corresponding N+ buried layer or layers. Consequently, the bulk micromachining process of this invention enables a micromachined element to be accurately predetermined and configured, resulting in a more accurate sensing device.

It should also be noted that, although the advantages associated with the polysilicon deposition and encapsulation processes of this invention are most apparent when used in conjunction with the bulk micromachining process of this invention, it is foreseeable that each of these inventive processes could be used alone or in conjunction with other bulk micromachining processes. Furthermore, each of the processes taught herein could also be employed in conjunction with other integrated circuit processes to fabricate semiconductor devices other than the pressure and motion sensing devices described.

Therefore, while our invention has been described in terms of a preferred embodiment, it is apparent that other forms could be adopted by one skilled in the art. Accordingly, the scope of our invention is to be limited only by the following claims.

The embodiments of the invention in which an exclusive property or privilege is claimed are defined as follows:

1. A method for micromachining a surface of a silicon substrate so as to form therein a micromachined element of a semiconductor device, the method comprising the steps of:

forming an N+ region in the surface of the substrate;

growing an epitaxial silicon layer over the surface of the substrate so as to form an N+ buried layer beneath the epitaxial silicon layer;

etching at least one trench through the epitaxial silicon layer and into the N+ buried layer; and laterally etching a cavity beneath the epitaxial silicon layer, the lateral etching step being conducted with chlorine gas at a pressure of about 100 to about 1000 mTorr and with the substrate at a temperature of at least about 35° C. so as to preferentially etch the N+ buried layer and thereby form the micromachined element between the cavity and the epitaxial silicon layer, the micromachined element being a component of the semiconductor device.

2. A method as recited in claim 1 further comprising the step of sealing the trench with a polysilicon film such that the cavity is sealed from the surface of the epitaxial silicon layer, the cavity forming a sealed reference chamber for a pressure sensing device.

3. A method as recited in claim 1 wherein the etching step forms a second trench through the epitaxial silicon layer and into the N+ buried layer, and wherein the method further comprises the step of sealing the second trench with a polysilicon film such that the micromachined element forms a membrane for a pressure sensing device.

4. A method as recited in claim 1 wherein the etching step forms the trench as an elongate trench which extends through the epitaxial silicon layer and into the N+ buried layer so as to form the micromachined element as a cantilevered beam which extends over the cavity, the cantilevered beam defining a suspended mass for a motion sensing device.

5. A method as recited in claim 1 wherein the etching step forms a second trench through the epitaxial silicon layer and into the N+ buried layer such that the micromachined element is a bridge over the cavity.

6. A method as recited in claim 1 wherein the etching step forms at least two elongate trenches which extend through the epitaxial silicon layer and into the N+ buried layer, the at least two elongate trenches defining the micromachined element as a mass which is suspended by at least two beams over the cavity.

7. A method as recited in claim 1 wherein:
the etching and lateral etching steps form a capacitor such that the trench defines opposing plates of the capacitor; and
the method further comprises the steps of:
depositing a conductive film on the opposing plates of the capacitor so as to reduce the distance between the opposing plates; and
etching back the conductive film so as to isolate the opposing plates from each other.

8. A method as recited in claim 1 further comprising the steps of:
forming an oxide layer on the epitaxial silicon layer prior to etching the trench;
applying a polysilicon layer on a surface of the oxide layer after etching the trench;
doping the polysilicon layer with a dopant;
masking a region of the polysilicon layer with a masking material;
etching exposed portions of the polysilicon layer from the surface of the oxide layer so as to leave at least one remaining polysilicon region on the oxide layer;
removing the masking material; and
activating the dopant in the remaining polysilicon region;
whereby the remaining polysilicon region defines an active integrated circuit device.

9. A method as recited in claim 1 further comprising the steps of:
filling the cavity and the trench with polyimide such that the micromachined element is immobilized;
depositing over the polyimide a first layer of material selected from the group consisting of silicon nitride and silicon dioxide;
annealing the first layer of material at a temperature and for a duration which are sufficient to relieve stress in the first layer of material;
forming at least one opening in the first layer of material;
etching the polyimide through the opening in the first layer of material so as to release the micromachined element; and
depositing over the first layer of material a second layer of material so as to seal the opening in the first layer of material and form an encapsulating layer over the micromachined element;
whereby the micromachined element is free to respond to motion of the substrate while being protected by the encapsulating layer.

10. A method as recited in claim 1 wherein the N+ buried layer is a first N+ buried layer formed by doping the substrate with a first n-type species, and wherein the epitaxial silicon layer is a first epitaxial silicon layer, the method further comprising the steps of:
forming a second N+ region in the surface of the first epitaxial silicon layer by doping a region of the first epitaxial silicon layer with a second n-type species which diffuses relatively slowly in silicon as compared to the first n-type species;
forming a third N+ region within a portion of the second N+ region and above a portion of the first N+ buried layer, the third N+ region being doped with an n-type species which diffuses relatively quickly in silicon as compared to the second n-type species;
growing a second epitaxial silicon layer over the first epitaxial silicon layer so as to form second and third N+ buried layers beneath the second epitaxial silicon layer and above the first N+ buried layer;
heat treating the substrate sufficiently to diffuse a portion of the n-type species of the third N+ buried layer into a portion of the first N+ buried layer, the heat treatment being insufficient to diffuse the first n-type species of the first N+ buried layer into any portion of the second N+ buried layer and being insufficient to diffuse the second n-type species of the second N+ buried layer into any portion of the first N+ buried layer, such that a portion of the first epitaxial silicon layer remains between a portion of the first N+ buried layer and a portion of the second N+ buried layer;
etching at least one trench through the second epitaxial silicon layer and into at least one of the first, second and third N+ buried layers; and
laterally etching a cavity beneath the second epitaxial silicon layer, the lateral etching step being conducted with chlorine gas at a pressure of about 100 to about 1000 mTorr and with the substrate at a temperature of at least about 35° C. so as to preferentially etch the first, second and third N+ buried layers
and thereby form the micromachined element between an upper portion of the cavity and a lower portion of the cavity, the micromachined element being a component of the semiconductor device.

11. A method for micromachining a surface of a silicon substrate so as to form a sensing device in the same substrate as at least one semiconductor device, the method comprising the steps of:
forming an N+ region in the surface of the substrate;
forming a silicon layer over the surface of the substrate so as to form an N+ buried layer beneath the silicon layer;
forming an etch mask on the silicon layer;

etching a plurality of trenches into the substrate and into the N+ buried layer;

laterally etching the N+ buried layer so as to form a cavity beneath the silicon layer, the lateral etching step being conducted with chlorine gas at a pressure of about 100 to about 1000 mTorr and with the substrate at a temperature of at least about 35° C. so as to preferentially etch the N+ buried layer;

forming an oxide layer on the substrate and on the surfaces defined by the trenches and the cavity; and depositing a polysilicon layer over the oxide layer so as to seal the trenches, such that the cavity is a sealed cavity beneath the surface of the substrate;

whereby a micromachined element is formed between the sealed cavity and the surface of the substrate, the micromachined element being a component of the sensing device.

12. A method as recited in claim 11 wherein the semiconductor device is formed on the substrate after the sensing device has been formed.

13. A method as recited in claim 11 wherein the semiconductor device is formed on the substrate prior to the sensing device being formed.

14. A method as recited in claim 11 wherein the lateral etching step forms at least two cavities beneath the surface of the substrate.

15. A method as recited in claim 14 wherein the step of depositing the polysilicon layer seals at least one of the at least two cavities to form a sealed reference chamber beneath the surface of the substrate, such that at least one of the at least two cavities remains vented to a surface of the substrate, each of the at least two cavities forming reference chambers for the sensing device.

16. A method as recited in claim 15 wherein the sealed reference chamber is sealed under a vacuum.

17. A method as recited in claim 14 wherein the step of depositing the polysilicon layer seals each of the two cavities so as to form two sealed reference chambers for the pressure sensing device.

18. A method as recited in claim 14 wherein the step of depositing the polysilicon layer seals each of the two cavities at the surface of the substrate, the method further comprising the step of:

masking an opposite surface of the substrate;

etching the opposite surface of the substrate so as to etch the substrate to the oxide layer formed on a first of the two cavities;

etching through the oxide layer of the first of the two cavities to the polysilicon layer deposited on the first of the two cavities; and etching the polysilicon layer of the first of the two cavities so as to vent the first of the two cavities to the opposite surface of the substrate;

whereby the first of the two cavities forms a first sensing device for sensing pressure at the opposite surface of the substrate and the other of the two cavities forms a second sensor for sensing pressure at the surface of the substrate, such that the first and second sensing devices serve as references to each other.

19. A method as recited in claim 18 wherein the step of etching the opposite surface of the substrate is a wet silicon etch.

20. A method as recited in claim 18 wherein the step of etching the opposite surface of the substrate is an anisotropic etch.

21. A method for micromachining a surface of a silicon substrate so as to form a sensing device therein, the method comprising the steps of:

forming a first N+ region in the surface of the substrate by doping the substrate with a first n-type species;

growing a first epitaxial silicon layer over the surface of the substrate so as to form a first N+ buried layer beneath the first epitaxial silicon layer;

forming a second N+ region in the first epitaxial silicon layer by doping a region of the first epitaxial silicon layer with a second n-type species which diffuses relatively slowly in silicon as compared to the first n-type species;

forming a third N+ region within a portion of the second N+ region and above a portion of the first N+ buried layer, the third N+ region being doped with an n-type species which diffuses relatively quickly in silicon as compared to the second n-type species;

growing a second epitaxial silicon layer over the first epitaxial silicon layer so as to form second and third N+ buried layers beneath the second epitaxial silicon layer and above the first N+ buried layer;

heat treating the substrate sufficiently to diffuse a portion of the n-type species of the third N+ buried layer into a portion of the first N+ buried layer, the heat treatment being insufficient to diffuse the first n-type species of the first N+ buried layer into any portion of the second N+ buried layer and being insufficient to diffuse the second n-type species of the second N+ buried layer into any portion of the first N+ buried layer, such that a portion of the first epitaxial silicon layer remains between a portion of the first N+ buried layer and a portion of the second N+ buried layer;

etching at least one trench through the second epitaxial silicon layer and into at least one of the first, second and third N+ buried layers; and laterally etching a cavity beneath the second epitaxial silicon layer, the lateral etching step being conducted with a chlorine-containing gas so as to preferentially etch the first, second and third N+ buried layers;

whereby a micromachined element is formed between an upper portion of the cavity and a lower portion of the cavity, the micromachined element being a component of the sensing device.

22. A method as recited in claim 21 wherein the first and second N+ buried layers are each doped with arsenic and the third N+ buried layer is doped with phosphorus.

23. A method as recited in claim 21 wherein at least one trench is etched into each of the second and third N+ buried layers.

24. A method as recited in claim 21 wherein at least one trench is etched into each of the first, second and third N+ buried layers.

25. A method as recited in claim 21 wherein the upper portion of the cavity is defined by the second N+ buried layer, the lower portion of the cavity is defined by the first N+ buried layer, and an intermediate portion of the cavity is defined by the third N+ buried layer.

26. A method for encapsulating a structure formed on a surface of a semiconductor material, the method comprising the steps of:

selectively patterning polyimide on the surface of the semiconductor material so as to cover the structure;

depositing over the polyimide a first layer of material selected from the group consisting of silicon nitride and silicon dioxide;

annealing the first layer of material at a temperature and for a duration which are sufficient to relieve stress in the first layer of material;

forming at least one opening in the first layer of material;

etching the polyimide through the opening in the first layer of material such that at least a portion of the first layer of material is suspended over the structure on the surface of the semiconductor material; and depositing over the first layer of material a second layer of material, the second layer of material sealing the opening in the first layer of material so as to form an encapsulating layer over the structure.

27. A method as recited in claim 26 wherein the polyimide is photosensitive.

28. A method as recited in claim 26 wherein the structure comprises a sensing element which is free to respond to stimuli applied to the semiconductor material while being protected by the encapsulating layer.

29. A method as recited in claim 26 wherein the structure further comprises integrated circuit elements.

30. A method for micromachining a surface of a silicon substrate so as to form a capacitor therein, the method comprising the steps of:

forming an N+ region in the surface of the substrate;

growing an epitaxial silicon layer over the surface of the substrate so as to form an N+ buried layer beneath the epitaxial silicon layer;

masking the epitaxial silicon layer;

etching at least one trench through the epitaxial silicon layer and into the N+ buried layer, the trench defining opposing plates of the capacitor;

laterally etching a cavity beneath the epitaxial silicon layer, the lateral etching step being conducted with chlorine-containing gas such that the N+ buried layer is preferentially etched;

depositing a conductive film on the opposing plates of the capacitor so as to reduce the distance between the opposing plates; and etching back the conductive film so as to isolate the opposing plates from each other.

31. A method as recited in claim 30 wherein the conductive film is polycrystalline silicon.

* * * * *